(12) United States Patent
Song et al.

(10) Patent No.: US 11,310,911 B2
(45) Date of Patent: Apr. 19, 2022

(54) THREE-DIMENSIONAL (3D) INTEGRATED CIRCUIT (IC) INTEGRATION OF AN EMBEDDED CHIP AND A PREFORMED METAL ROUTING STRUCTURE

(71) Applicant: QUALCOMM Incorporated, San Diego, CA (US)

(72) Inventors: Stanley Seungchul Song, San Diego, CA (US); Jonghae Kim, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/929,004

(22) Filed: Jul. 14, 2020

(65) Prior Publication Data

US 2022/0022315 A1  Jan. 20, 2022

(51) Int. Cl.
| | |
|---|---|
| H05K 1/11 | (2006.01) |
| G06F 1/18 | (2006.01) |
| H05K 3/10 | (2006.01) |
| H05K 3/40 | (2006.01) |
| H05K 1/02 | (2006.01) |

(52) U.S. Cl.
CPC .............. *H05K 1/111* (2013.01); *G06F 1/189* (2013.01); *H05K 1/0284* (2013.01); *H05K 1/115* (2013.01); *H05K 3/101* (2013.01); *H05K 3/4007* (2013.01); *H05K 3/4038* (2013.01); *H05K 2203/1327* (2013.01)

(58) Field of Classification Search
CPC ...... H05K 1/111; H05K 3/4007; H05K 3/101; H05K 3/4038; H05K 2203/1327; H05K 1/115
USPC ......................................................... 361/760
See application file for complete search history.

(56) References Cited

U.S. PATENT DOCUMENTS

| | | | |
|---|---|---|---|
| 2011/0215464 A1* | 9/2011 | Guzek ..................... | H01L 21/56 257/737 |
| 2012/0161315 A1* | 6/2012 | Lin .................... | H01L 23/49816 257/738 |
| 2012/0161331 A1* | 6/2012 | Gonzalez ............ | H01L 23/5389 257/774 |
| 2014/0084478 A1* | 3/2014 | Simion ................... | H01L 24/97 257/774 |
| 2015/0001731 A1* | 1/2015 | Shuto ..................... | H01L 25/18 257/774 |

(Continued)

*Primary Examiner* — Sherman Ng
(74) *Attorney, Agent, or Firm* — Qualcomm Incorporated

(57) ABSTRACT

An integrated circuit (IC) package is described. The IC package includes a metallization structure. The IC package also includes a first die in a package substrate layer. The package substrate includes a first surface and a second surface, opposite the first surface. The second surface of the package substrate layer is on the metallization structure. The IC package further includes a second die on the first surface of the package substrate layer and on the first die. The IC package also includes through vias in the package substrate layer to couple pads of the second die to metal routing layers at a first surface of the metallization structure. The IC package further includes package bumps on a second surface of the metallization structure, opposite the first surface, and coupled to the pads of the second die through the metal routing layers.

17 Claims, 9 Drawing Sheets

(56) References Cited

U.S. PATENT DOCUMENTS

2015/0318262 A1* 11/2015 Gu .................. H01L 25/0655
  257/738
2019/0067145 A1* 2/2019 Chun ................ H01L 21/6835
2019/0312016 A1* 10/2019 O'Sullivan .......... H01L 21/565

* cited by examiner

THREE-DIMENSIONAL (3D) INTEGRATED CIRCUIT (IC) INTEGRATION OF AN EMBEDDED CHIP AND A PREFORMED METAL ROUTING STRUCTURE

BACKGROUND

Field

Aspects of the present disclosure relate to integrated circuits and, more particularly, to a three-dimensional (3D) integrated circuit (IC) integration of an embedded chip and preformed metal routing layers of a metallization structure.

Background

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile applications demand a small form factor, low cost, a tight power budget, and high electrical performance. Mobile package design has evolved to meet these divergent goals for enabling mobile applications that support multimedia enhancements. These mobile applications, however, are susceptible to routing issues when multiple dies are arranged within the small form factor.

SUMMARY

An integrated circuit (IC) package is described. The IC package includes a metallization structure. The IC package also includes a first die in a package substrate layer. The package substrate includes a first surface and a second surface, opposite the first surface. The second surface of the package substrate layer is on the metallization structure. The IC package further includes a second die on the first surface of the package substrate layer and on the first die. The IC package also includes through vias in the package substrate layer to couple pads of the second die to metal routing layers at a first surface of the metallization structure. The IC package further includes package bumps on a second surface of the metallization structure, opposite the first surface, and coupled to the pads of the second die through the metal routing layers.

A method for fabricating stacked dies within an integrated circuit (IC) package is described. The method includes encapsulating a first die in a package substrate layer having a first surface and a second surface, opposite the first surface. The method also includes forming through vias in the package substrate layer. The method further includes forming a metallization structure on the second surface of the package substrate layer. The method also includes bonding a second die to the first surface of the package substrate layer and a surface of the first die. The method further includes forming package bumps on a surface of the metallization structure, opposite the package substrate layer, to contact pads of the second die through metal routing layers of the metallization structure.

An integrated circuit (IC) package is described. The IC package includes a metallization structure. The IC package also includes means for storing data in a package substrate layer. The package substrate includes a first surface and a second surface, opposite the first surface. The second surface of the package substrate layer is on the metallization structure. The IC package further includes an active die on the first surface of the package substrate layer and on the data storing means. The IC package also includes through vias in the package substrate layer to couple pads of the active die to metal routing layers at a first surface of the metallization structure. The IC package further includes package bumps on a second surface of the metallization structure, opposite the first surface, and coupled to the pads of the second die through the metal routing layers.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
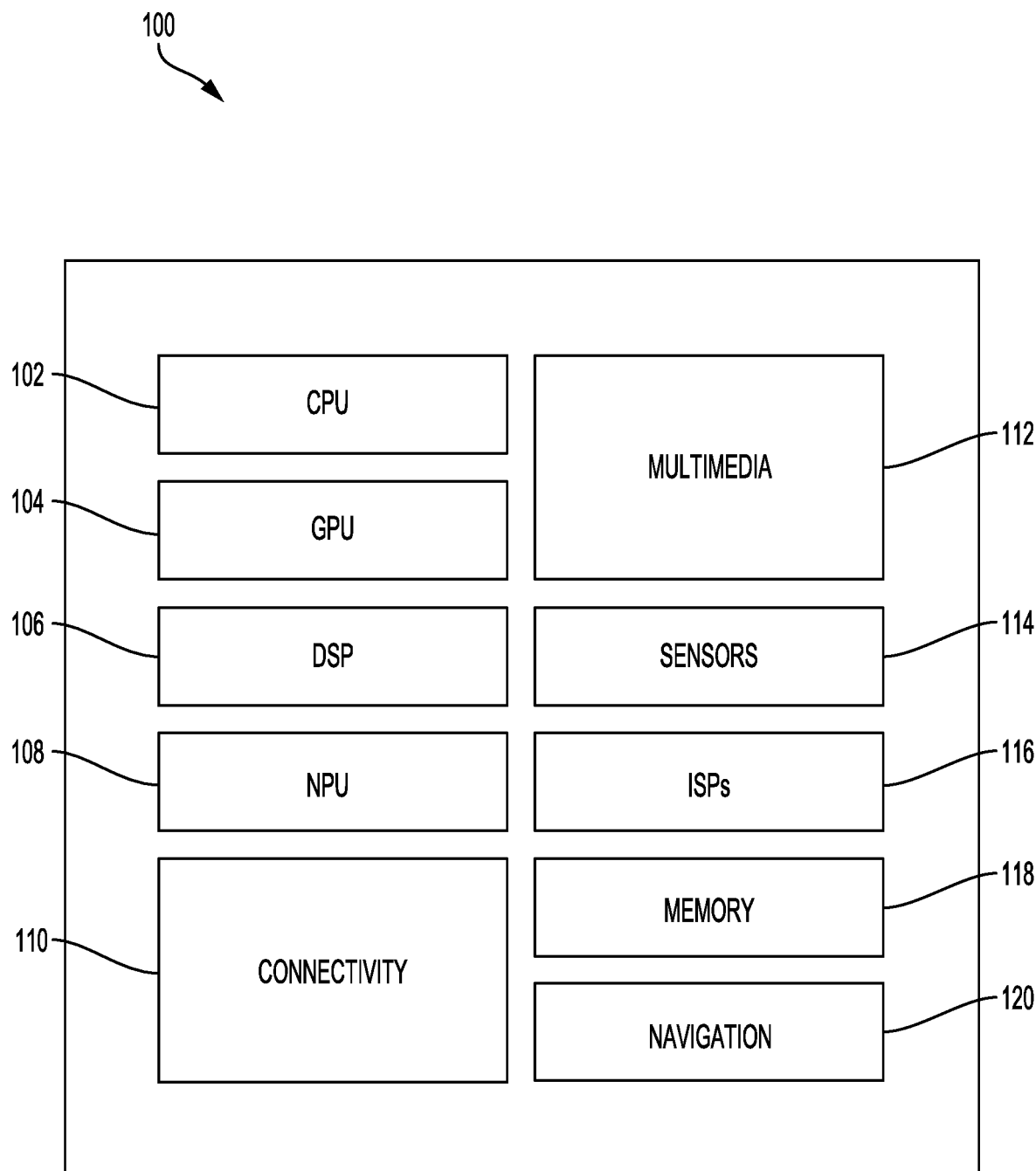
FIG. 1 illustrates an example implementation of a system-on-a-chip (SOC), including a three-dimensional (3D) integrated circuit (IC) integration of an embedded chip and preformed metal routing layers of a metallization structure, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described, the term "proximate" used throughout this description means "adjacent, very near, next to, or close to." As described, the term "on" used throughout this description means "directly on" in some configurations, and "indirectly on" in other configurations.

A system hierarchy includes interconnection of active devices at a lowest system level all the way up to system level interconnections at a highest level. In particular, electrical connections exist at each of the levels of the system hierarchy to connect different devices together on an integrated circuit. As integrated circuits become more complex, however, more interconnect layers are used to provide the electrical connections between the devices. More recently, the number of interconnect levels for circuitry has substantially increased due to the large number of devices that are now interconnected in a modern electronic device.

These interconnections include back-end-of-line (BEOL) interconnect layers, which may refer to the conductive interconnect layers for electrically coupling to front-end-of-line (FEOL) active devices of an integrated circuit (IC). The various BEOL interconnect layers are formed at corresponding BEOL interconnect levels, in which lower BEOL interconnect levels use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile applications demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a new development in packaging technology that is useful for mobile applications. This chip first FO-WLP process technology solution provides flexibility to fan-in and fan-out connections from a die to a package ball. In addition, this solution also provides a height reduction of a first level interconnect between the die and the package balls of mobile applications. These mobile applications, however, are susceptible to routing issues when multiple dies are arranged within the small form factor.

Various aspects of the present disclosure provide 3D IC integration of an embedded chip and preformed metal routing layers of a metallization structure. The process flow for fabrication of the embedded chip and preformed metal routing layers of a metallization structure may include a WLP process technology. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. As further described, the term "laminate" may refer to a multilayer sheet to enable packaging of an IC device. The terms "substrate," "wafer," and "laminate" may be used interchangeably. Similarly, the terms "chip," "chiplet," and "die" may be used interchangeably.

Aspects of the present disclosure are directed to 3D IC integration of a first die embedded in a package substrate layer (e.g., a mold layer) having a first surface on a metallization structure and a second surface coupled to a second die (active die) on the first die (e.g., a memory die). One aspect of the present disclosure is directed to a 3D IC stacking integration scheme, in which a chiplet embedded in a package substrate layer is coupled to a metallization structure formed using a fan-out (FO) redistribution layer (RDL) (FO-RDL) first process. In one configuration, two or more dies (e.g., a memory chiplet and a logic chiplet) are stacked face-to-face, which may be referred to as stacked chiplets (or stacked dies).

Fabricating contact (e.g., pin) routing through or around the stacked dies to contact between die pads and package bumps (e.g., solder bumps) is a concern. In particular, FO-RDL specifications involve a specified number of contacts (e.g., pins). As a result, metal routing layers (e.g., redistribution layers) of a metallization structure are designed to accommodate a number of package bumps. These package bumps cannot be placed within the footprint of a larger one of the first die stacked on the second die (e.g., chiplet). A proposed method resolves the contact routing issue by having a two-step metallization structure process, in which metal routing layers are first placed around and on (e.g., over or under) the first die (e.g., a smaller chiplet) embedded in the package substrate layer. In this configuration, a larger die is then bonded over the smaller die and a preformed metallization structure (e.g., an FO-RDL).

In one configuration, the proposed method begins by depositing a spin-on oxide layer to embed the die in the package substrate layer (e.g., a mold layer). This is followed by formation of through vias (e.g., through mold vias (TMVs)) formed through the package substrate layer in a location corresponding to a bond pad of a second die. Formation of the package substrate layer using a spin-on oxide layer can provide better thermal expansion to compensate for a material layer (e.g., oxide/copper (Cu)) from the bonded second die. The process continues by using an organic based metallization (e.g., RDL) process. In this configuration, metal routing layers of the metallization structure are formed on the package substrate layer surrounding the first die (e.g., smaller chiplet) embedded in the package substrate layer. The metal routing layers of the metallization structure interface with package bumps to enable mounting on a board (e.g., a printed-circuit board (PCB)).

FIG. 1 illustrates an example implementation of a host system-on-a-chip (SOC) 100, which includes a three-dimensional (3D) integrated chip (IC) integration of an embedded chip and preformed metal routing layers of a metallization structure, in accordance with aspects of the present disclosure. The host SOC 100 includes processing blocks tailored to specific functions, such as a connectivity block 110. The connectivity block 110 may include fifth generation (5G) new radio (NR) connectivity, fourth generation long term evolution (4G LTE) connectivity, Wi-Fi connectivity, USB connectivity, Bluetooth® connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

Figure 2:
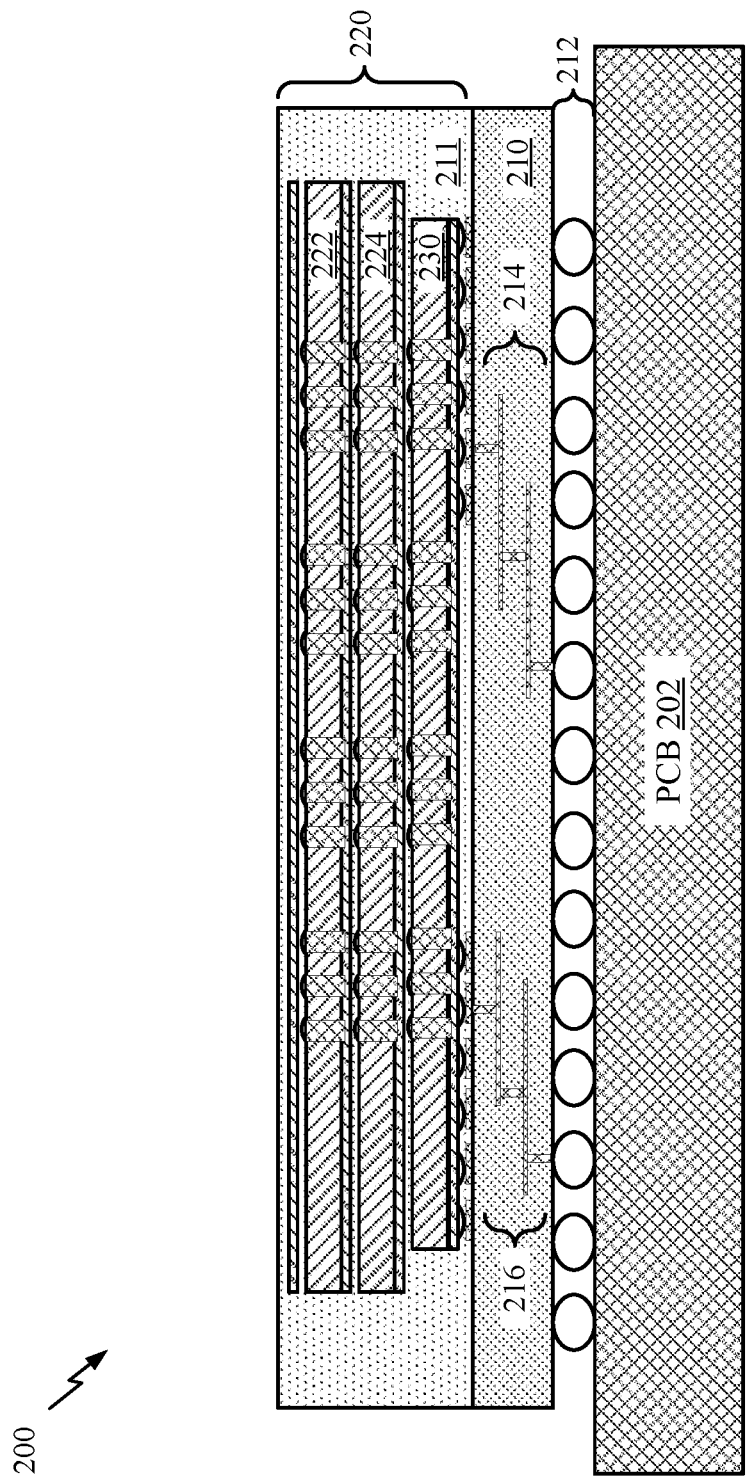
FIG. 2 shows a cross-sectional view of a stacked integrated circuit (IC) package, including the system-on-a-chip (SOC) of FIG. 1.

FIG. 2 shows a cross-sectional view illustrating a stacked IC package 200 of the SOC 100 of FIG. 1. Representatively, the stacked IC package 200 includes a printed circuit board (PCB) 202 connected to a package substrate 210 with interconnects 212. In this configuration, the package substrate 210 includes conductive layers 214 and 216. Above the package substrate 210 is a 3D chip stack 220, including stacked dies 222, 224, and 230, encapsulated by mold compound 211. In one aspect of the present disclosure, the die 230 is the SOC of FIG. 1.

Figure 3:
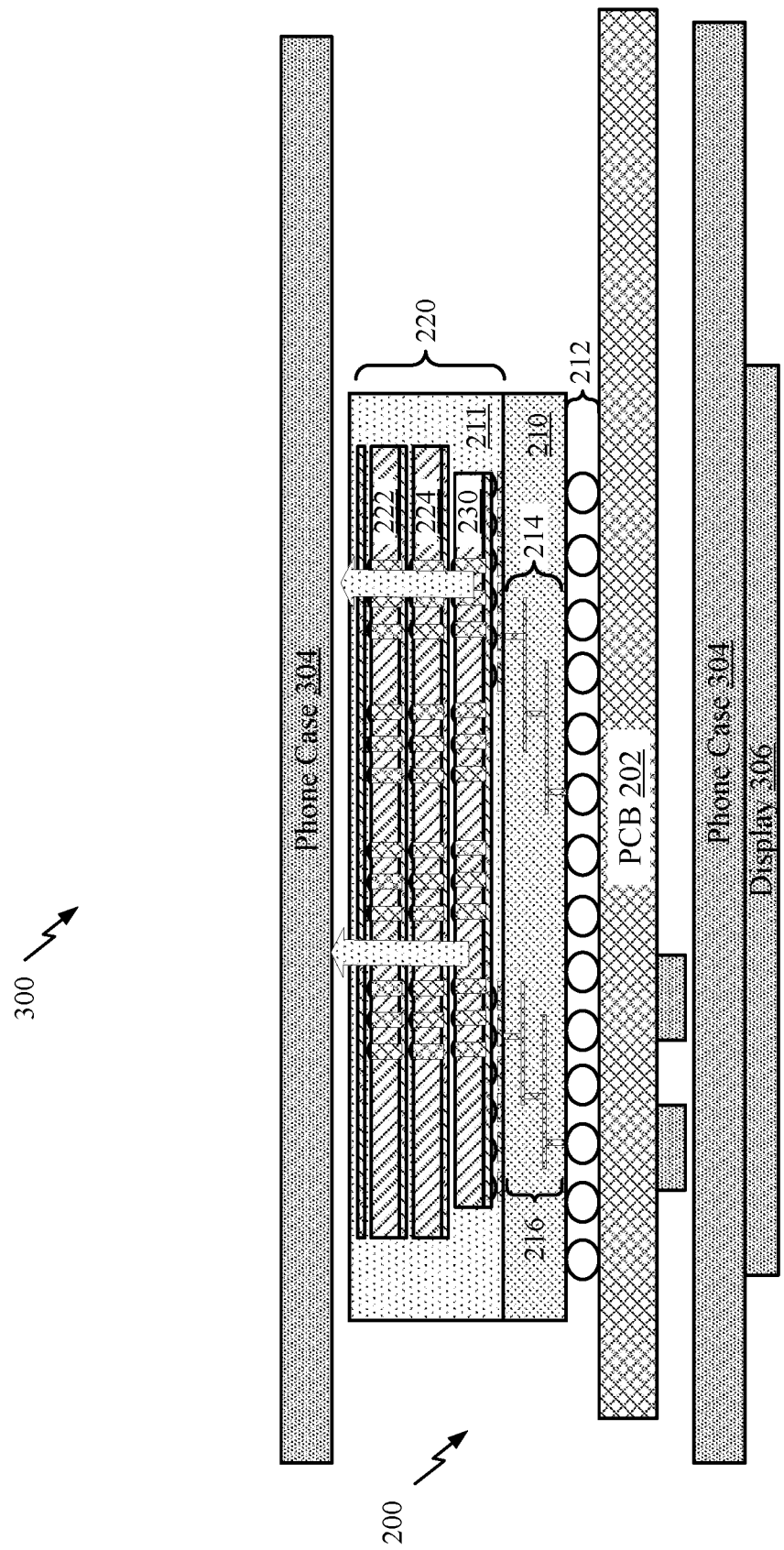
FIG. 3 shows a cross-sectional view illustrating the stacked integrated circuit (IC) package of FIG. 2, incorporated into a mobile device, according to one aspect of the present disclosure.

FIG. 3 shows a cross-sectional view illustrating the stacked IC package 200 of FIG. 2, incorporated into a wireless device 300, according to one aspect of the present disclosure. As described, the wireless device 300 may include, but is not limited to, a smartphone, tablet, handheld device, or other limited form factor device configured for 5G communications. Representatively, the stacked IC package 200 is arranged within a phone case 304, including a display 306. In this configuration, the 3D IC integration of an embedded chip and preformed metal routing layers of a metallization structure (not shown) are integrated into the stacked IC package 200, for example, as shown in FIG. 4.

Figure 4:
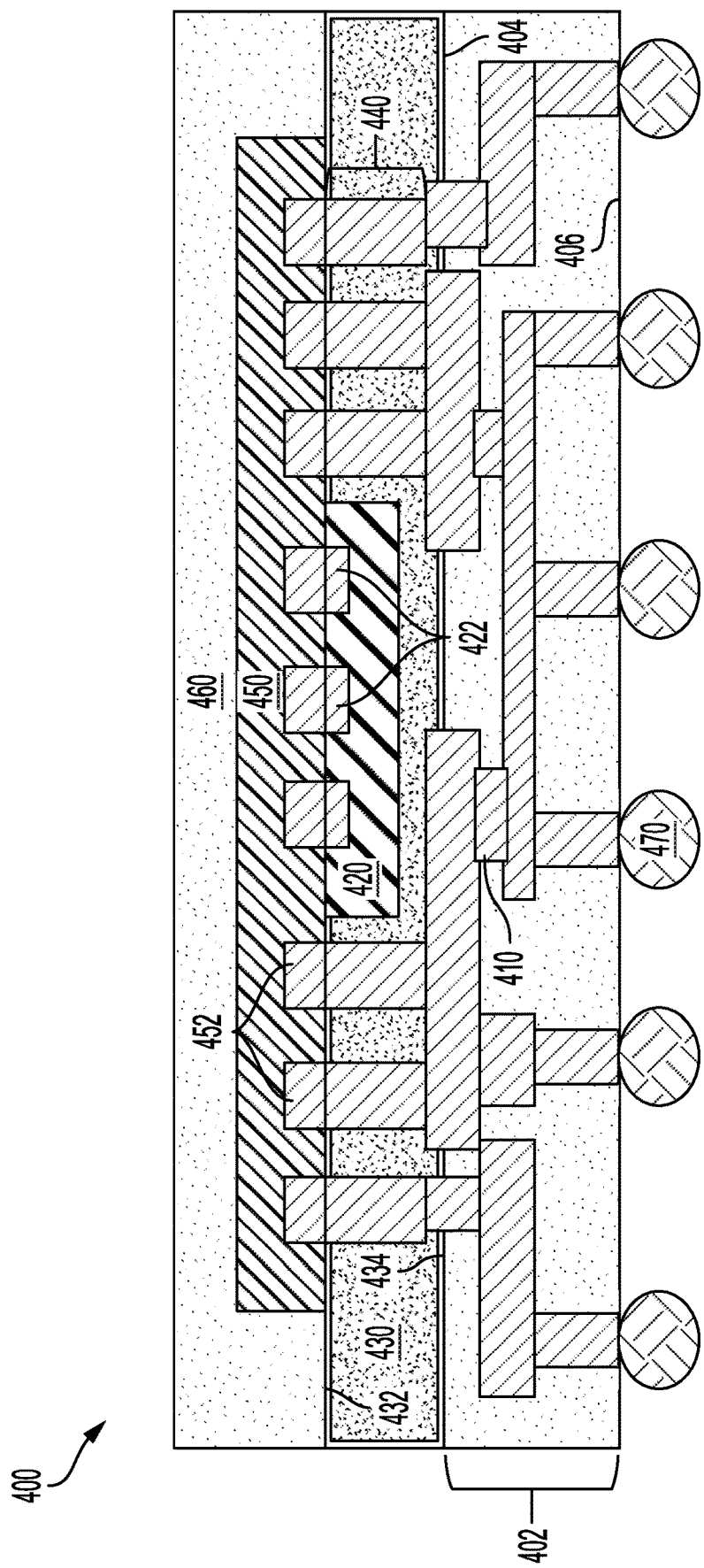
FIG. 4 illustrates an integrated circuit (IC) package having stacked dies coupled to a preformed metallization structure, according to aspects of the present disclosure.

FIG. 4 illustrates an IC package 400 having stacked dies coupled to a preformed metallization structure, according to aspects of the present disclosure. In one configuration, the IC package 400 includes a metallization structure 402 and a first die 420 embedded in a package substrate layer 430 (e.g., a mold layer). In this configuration, the package substrate layer 430 includes a first surface 432 and a second surface 434, opposite the first surface 432. The second surface 434 of the package substrate layer 430 is on the metallization structure 402. The IC package 400 also includes a second die 450 on the first surface 432 of the package substrate layer 430 and stacked on the first die 420. The IC package 400 also includes through vias 440 in the package substrate layer 430 to couple to pads 452 of the second die 450 to metal routing layers 410 at a first surface 404 of the metallization structure 402. The IC package 400 further includes package bumps 470 on a second surface 406 of the metallization structure 402. In this configuration, a first package bump 470 is coupled to the pads 452 of the second die 450 through the metal routing layers 410 of the metallization structure.

The IC package 400 includes the metallization structure 402 (e.g., redistribution layers (RDLs)) to contact the pads 452 of the second die 450. As described, the metallization structure 402 may be composed of multiple dielectric layers (e.g., silicon oxide (SiOx)), interconnects (e.g. pads, vias, metal layers, and/or traces) and an organic layer (e.g., polyimide). As described, the terms "metallization structure" and "redistribution layers" (RDLs) may be used interchangeably. In one configuration, the metallization structure 402 is formed prior to stacking the first die 420 on the second die 450. In this configuration, the second die 450 is encapsulated in a molding compound 460. In addition, a length of the second die 450 is greater than a length of the first die 420. As a result, a portion of the pads 452 of the second die 450 are directly bonded to pads 422 of the first die 420. In one configuration, the pads 422 of the first die 420 may be directly coupled to the metal routing layers 410 of the metallization structure 402 using through substrate vias (e.g., micro-TSVs not shown). In this configuration, a first surface of the first die 420 is coplanar with the first surface 432 of the package substrate layer 430 to enable a direct bond (e.g., face-to-face) between the first die 420 and the second die 450.

According to aspects of the present disclosure, through vias 440 are formed after the first die 420 is encapsulated in the package substrate layer 430 (e.g., a spin-on oxide). The through vias 440 are formed in the package substrate layer 430 and placed in preparation for enabling routing between a remaining portion of the pads 452 of the second die 450 and metal routing layers 410 of the metallization structure 402. The TMVs 440 may be composed of a conductive material (e.g., plated copper (Cu)). In addition, an under bump metallization layer (not shown) enables contact between the package bumps 470 and the metal routing layers 410 of the metallization structure 402. The formation of the package bumps 470 on the second surface 406 of the metallization structure 402 completes formation of the IC package 400. The package bumps 470 (e.g., package balls) may be composed of solder.

FIGS. 5A-5G are cross-sectional diagrams illustrating a process of fabricating the IC package 400 of FIG. 4, having stacked dies coupled to a preformed metallization structure of FIG. 4, according to aspects of the present disclosure. Although two stacked dies are shown in FIGS. 5A-5G, it should be recognized that any number of stacked dies may be used depending on the desired application, such as a processor die package.

Figure 5A:
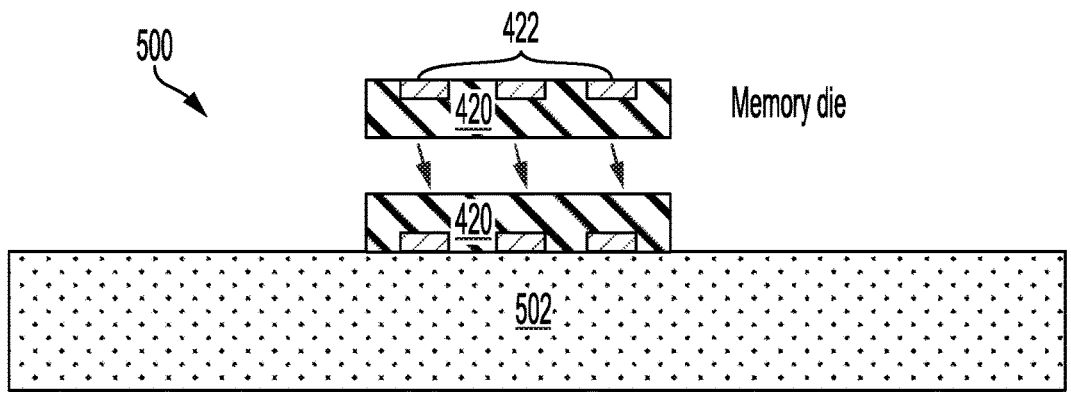
FIGS. 5A-5G are cross-sectional diagrams illustrating a process of fabricating the integrated circuit (IC) package of FIG. 4, having stacked dies coupled to a preformed metallization structure, according to aspects of the present disclosure.

As shown in FIG. 5A, at step 500, the first die 420 is attached to a surface of a carrier substrate 502. In this example, the first die 420 is a memory die (e.g., static random access memory (SRAM) or other like memory die), or other like lower performance die. The first die 420 may be initially diced from a wafer of memory dies and cleaned before attachment to the surface of the carrier substrate 502.

Figure 5B:
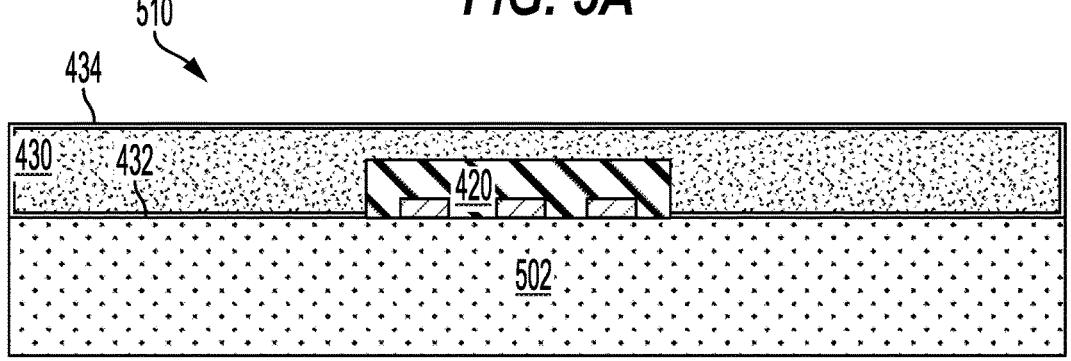

As shown in FIG. 5B, at step 510, the package substrate layer 430 is formed on the first die 420 and the carrier substrate 502, according to aspects of the present disclosure. In one configuration, the package substrate layer 430 is formed by depositing a spin-on oxide on exposed surfaces of the first die 420 and a surface of the carrier substrate 502. Once encapsulated in the package substrate layer 430, the first die 420 may be referred to as an embedded die, embedded chip, and/or an embedded chiplet. Formation of the package substrate layer 430 is followed by a patterning and plating process to form the through vias 440 of FIG. 4.

Figure 5C:
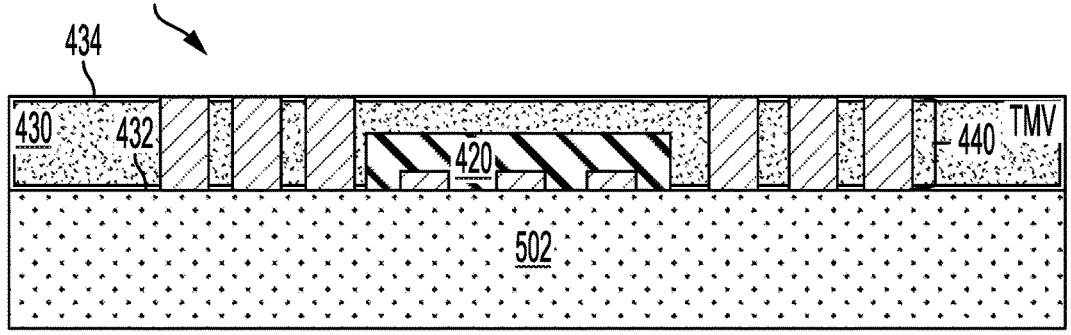

As shown in FIG. 5C, at step 520, a patterning and electroplating process is performed within the package substrate layer 430 to form the through vias 440, according to aspects of the present disclosure. The through vias 440 may be composed of a conductive material (e.g., plated copper (Cu)). The through vias 440 are formed within the package substrate layer 430 based on a pad pattern of the second die 450. In particular, locations of the through vias 440 are selected to enable routing between exposed pads of the second die 450 (see FIGS. 4, 5F, and 5G) and metal routing layers 410 of the metallization structure 402 (see FIG. 5D).

Figure 5D:
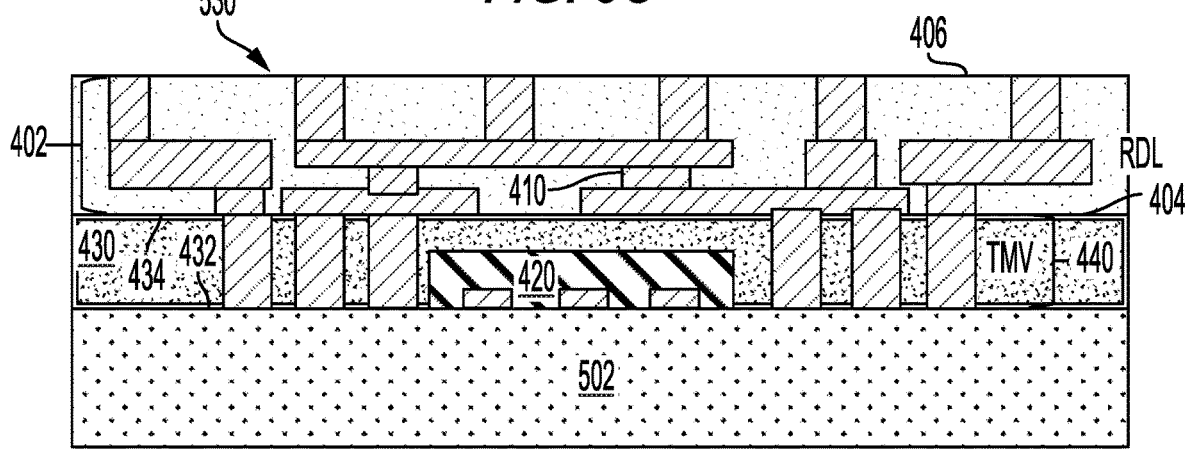

As shown in FIG. 5D, at step 530, the metallization structure 402 is formed on the second surface 434 of the package substrate layer 430, according to aspects of the present disclosure. In this example, FIGS. 5C and 5D illustrate a two-step process to form the metallization structure 402 and the through vias 440. In this configuration, metal routing layers 410 and the through vias 440 are first placed around and on (e.g., over or under) the first die 420 embedded in the package substrate layer 430. In this configuration, the metallization structure 402 includes metal routing layers 410 within multiple dielectric layers and composed of interconnects (e.g. pads, vias, metal layers, and/or traces). As described, the terms "metallization structure" and "redistribution layers" (RDL) may be used interchangeably (e.g., a fan-out redistribution layer (FO-RDL)).

Figure 5E:
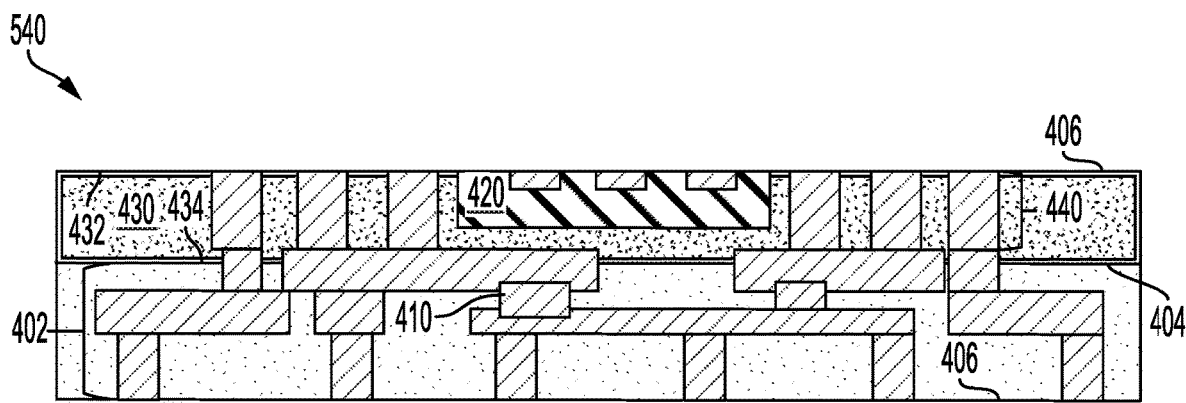

As shown in FIG. 5E, at step 540, the carrier substrate 502 is removed from the first surface 432 of the package substrate layer 430, according to aspects of the present disclosure. In this example, the first surface 432 of the package substrate layer 430 is cleaned following removal of the carrier substrate 502. Cleaning of the first surface 432 of the package substrate layer 430 exposes the through vias 440. As noted, locations of the through vias 440 are selected to align with a pad pattern of the second die 450, as shown in FIG. 4. In this configuration, the second die 450 (e.g., the larger die) may be bonded on the first die 420 (e.g., the smaller die) after the metallization structure 402 (e.g., a preformed metallization structure) is formed on the second surface 434 of the package substrate layer 430.

Figure 5F:
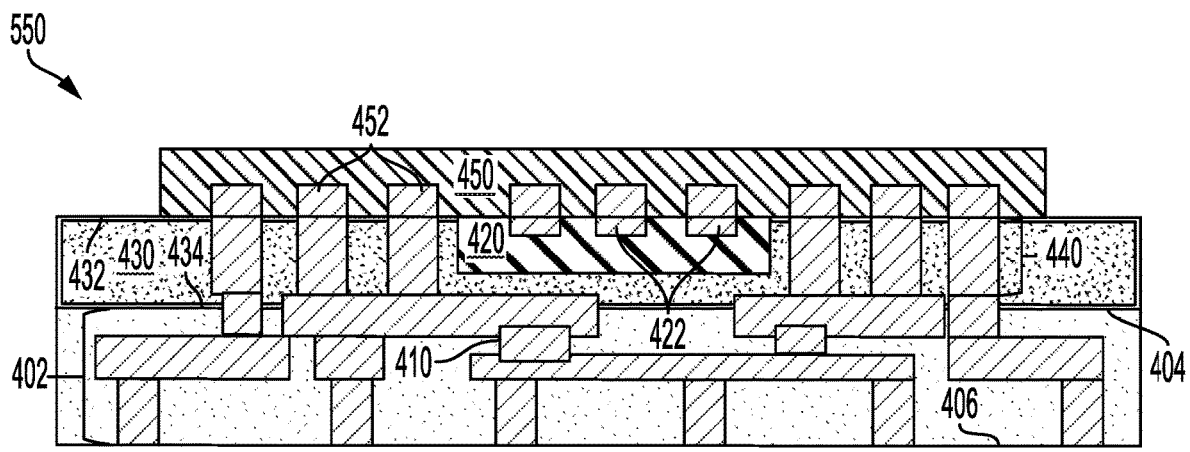

As shown in FIG. 5F, at step 550, the second die 450 is bonded to an exposed surface of the first die 420 and the first surface 432 of the package substrate layer 430, according to aspects of the present disclosure. In this example, the second die 450 is bonded on the first surface 432 of the package substrate layer 430 and stacked on the first die 420. In this example, the second die 450 is a logic die or other like high performance die relative to the first die 420. That is, a performance level of the second die 450 is greater than a performance level of the first die 420. In addition, a length of the second die 450 is greater than a length of the first die 420. As a result, a portion of the through vias 440 (e.g., not coupled to the pads 422 of the first die 420) are coupled to the pads 452 of the second die 450 (e.g., pads of the second die 450 exposed by the first die 420). The through vias 440 enable coupling between the pads 452 of the second die 450 to the metal routing layers 410 of the metallization structure 402. The second die 450 may be directly bonded to the first die 420 according to a die-to-die bonding configuration to form a 3D IC package, according to aspects of the present disclosure. Alternatively, bonding for the second die 450 to the first surface 432 of the package substrate layer 430 may be referred to as a die-to-wafer bonding configuration combined with a die-to-die bonding configuration, according to aspects of the present disclosure.

Figure 5G:
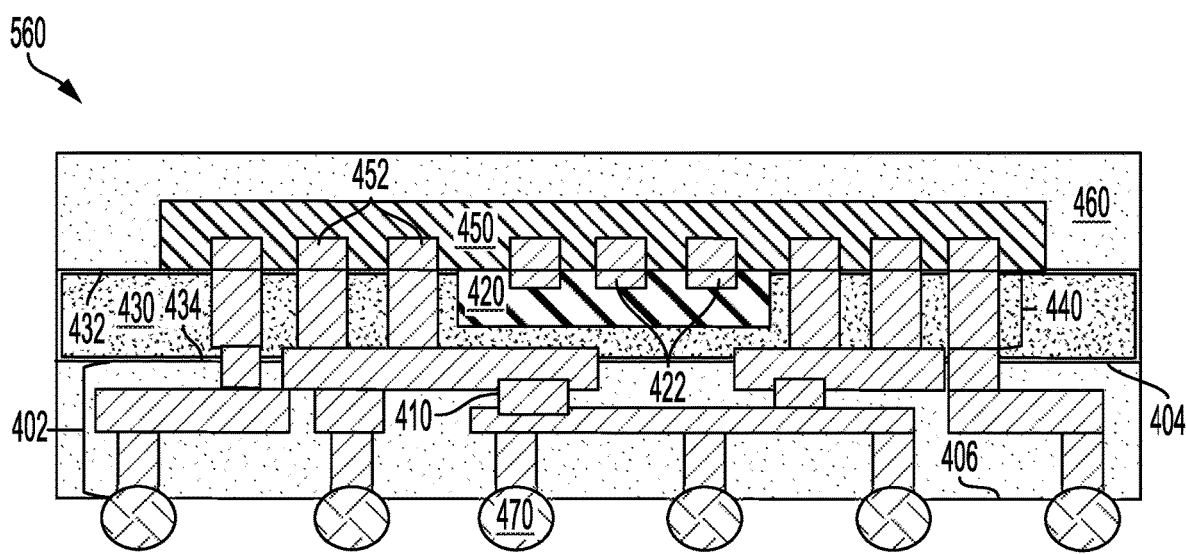

As shown in FIG. 5G, at step 560, the IC package 400 is completed by encapsulating the second die 450 and forming of the package bumps 470 on the second surface 406 of the metallization structure 402, according to aspects of the present disclosure. In this example, the second die 450 is encapsulated in the molding compound 460. In addition, the package bumps 470 are formed on the second surface 406 of the metallization structure 402. In this configuration, the package bumps 470 enable coupling to the pads 452 of the second die 450 through the metal routing layers 410 of the metallization structure 402. In this example, the IC package 400 is reflowed to form the package bumps 470. That is, an alloy (e.g., tin (Sn) and silver (Ag)) may be electroplated onto the metal routing layers 410 at the second surface 406 of the metallization structure 402. An under bump metallization layer (not shown) may be formed between the package bumps 470 and the metal routing layers 410 at the second surface 406 of the metallization structure 402.

Figure 6:
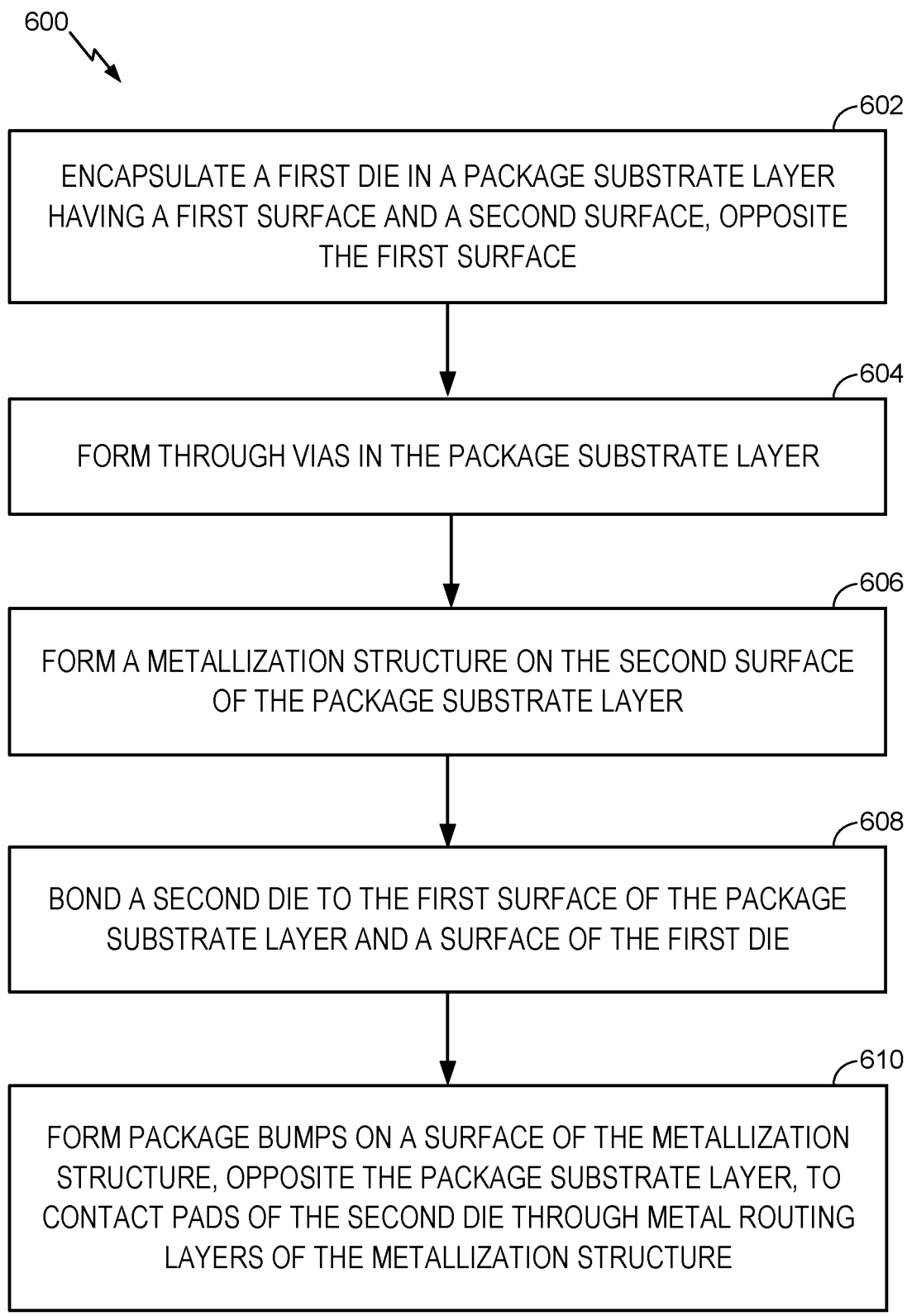
FIG. 6 is a process flow diagram illustrating a method for fabricating stacked dies within an integrated circuit (IC) package, according to an aspect of the present disclosure.

FIG. 6 is a process flow diagram illustrating a method for fabricating stacked dies within an IC package, according to an aspect of the present disclosure. A method 600 begins in block 602, in which a first die is encapsulated within a package substrate layer having a first surface and a second surface, opposite the first surface. As shown in FIG. 5B, the package substrate layer 430 is formed on the first die 420 and the carrier substrate 502, according to aspects of the present disclosure. In one configuration, the package substrate layer 430 is a mold layer formed by depositing a spin-on oxide on exposed surfaces of the first die 420 and a surface of the carrier substrate 502. Forming of the package substrate layer 430 occurs after the first die 420 is attached to a surface of a carrier substrate 502, as shown in FIG. 5A.

At block 604, through vias are formed in the package substrate layer. For example, as shown in FIG. 5C, at step 520, a patterning and electroplating process is performed within the package substrate layer 430 to form the through vias 440. The through vias 440 may be composed of a conductive material (e.g., plated copper (Cu)). In this example, the through vias 440 are formed within the package substrate layer 430 based on a pad pattern of the second die 450. Locations of the through vias 440 may be selected to enable routing between exposed pads of the second die 450 (see FIGS. 4, 5F, and 5G) and metal routing layers 410 of the metallization structure 402, as shown in FIG. 5D.

At block 606, a metallization structure is formed on the second surface of the package substrate layer. For example, as shown in FIG. 5D, at step 530, the metallization structure 402 is formed on the second surface 434 of the package substrate layer 430, according to aspects of the present disclosure. In this example, FIGS. 5C and 5D illustrate a two-step process to form the metallization structure 402 and the through vias 440. In this configuration, metal routing layers 410 and the through vias 440 are first placed around and on (e.g., over or under) the first die 420 embedded in the package substrate layer 430. In this configuration, the metallization structure 402 includes metal routing layers 410 within multiple dielectric layers and composed of interconnects (e.g. pads, vias, metal layers, and/or traces).

At block 608, a second die is bonded to the first surface of the package substrate layer and a surface of the first die. For example, as shown in FIG. 5F, at step 550, the second die 450 is bonded to an exposed surface of the first die 420 and the first surface 432 of the package substrate layer 430.

In this example, the second die 450 is bonded on the first surface 432 of the package substrate layer 430 and stacked on the first die 420. The second die 450 may be a logic die or other like high performance die relative to the first die 420. In addition, the length of the second die 450 is greater than the length of the first die 420.

At block 610, package bumps are formed on a surface of the metallization structure, opposite the package substrate layer, to contact pads of the second die through metal routing layers of the metallization structure. For example, as shown in FIG. 5G, at step 560, the IC package 400 is completed by encapsulating the second die 450 and forming the package bumps 470 on the second surface 406 of the metallization structure 402. In this example, the second die 450 is encapsulated in the molding compound 460. In addition, the package bumps 470 are formed on the second surface 406 of the metallization structure 402. In this configuration, the package bumps 470 enable coupling to the pads 452 of the second die 450 through the metal routing layers 410 of the metallization structure 402.

Aspects of the present disclosure are directed to an embedded smaller die (e.g., chip/chiplet) and a metallization structure (e.g., a fan-out redistribution layer (FO-RDL)) placed around and above (or under) the embedded smaller die. In one configuration, direct bonding is performed between a second larger die to the embedded smaller first die, such that the first embedded die and the second die have different sizes. Further, a material composition of a portion of the metallization structure (e.g., the FO-RDL layers) have a dielectric material (e.g., silicon oxide (SiOx), or similar composition) between metal routing layers. In addition, a portion of the metallization structure 402 is composed of an organic material to enable formation of the package bumps 470 as solder bumps. In this configuration, the method 600 may include depositing a first passivation layer (e.g., polyimide) on the metal routing layers 410 of the metallization structure 402, and depositing additional passivation layers on a first passivation layer.

According to a further aspect of the present disclosure, an IC package includes a stacked dies within an IC package. In one configuration, the IC package includes means for storing data. In one configuration, the data storing means may be a memory die, such as the first die 420 shown in FIGS. 4-5G. In another aspect, the aforementioned means may be any structure or any material configured to perform the functions recited by the aforementioned means.

Figure 7:
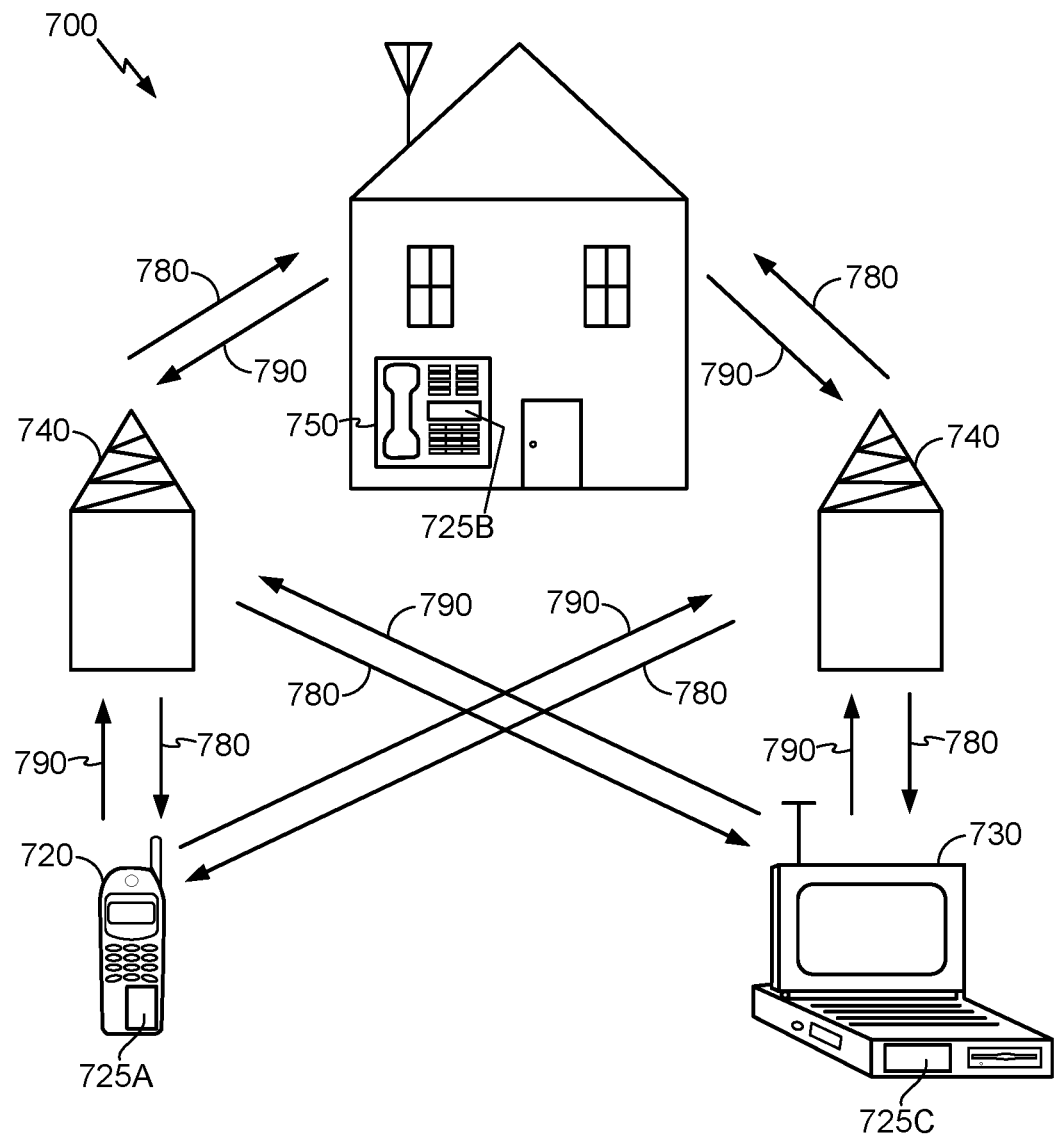
FIG. 7 is a block diagram showing an exemplary wireless communications system in which a configuration of the present disclosure may be advantageously employed.

FIG. 7 is a block diagram showing an exemplary wireless communications system 700 in which an aspect of the present disclosure may be advantageously employed. For purposes of illustration, FIG. 7 shows three remote units 720, 730, and 750, and two base stations 740. It will be recognized that wireless communications systems may have many more remote units and base stations. Remote units 720, 730, and 750 include IC devices 725A, 725B, and 725C that include the disclosed 3D IC package. It will be recognized that other devices may also include the disclosed 3D IC package, such as the base stations, switching devices, and network equipment. FIG. 7 shows forward link signals 780 from the base stations 740 to the remote units 720, 730, and 750, and reverse link signals 790 from the remote units 720, 730, and 750 to the base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be a mobile phone, a hand-held personal communications system (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 7 illustrates remote units according to aspects of the present disclosure, the disclosure is not limited to these exemplary illustrated units. Aspects of the present disclosure may be suitably employed in many devices, which include the disclosed 3D IC package.

Figure 8:
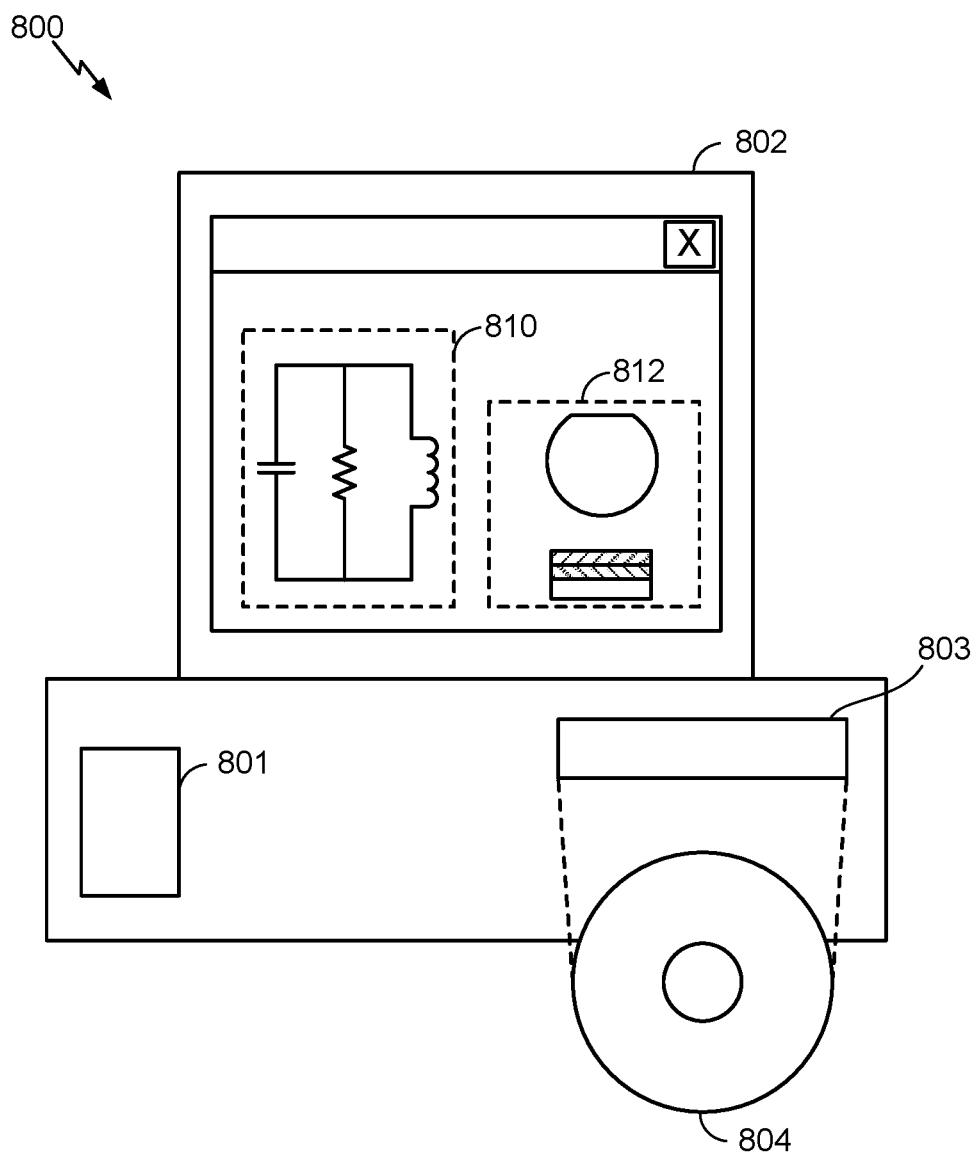
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the 3D IC package disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812, such as a 3D IC package. A storage medium 804 is provided for tangibly storing the design of the circuit 810 or the semiconductor component 812 (e.g., the 3D IC package). The design of the circuit 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the semiconductor component 812 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined may be applied to other variations without departing from the spirit or scope of the disclosure. Thus, the disclosure is not intended to be limited to the examples and designs described but is to be accorded the widest scope consistent with the principles and novel features disclosed.

What is claimed is:

1. An integrated circuit (IC) package, comprising:
   a metallization structure;
   a first die in a package substrate layer having a first surface and a second surface, opposite the first surface, the second surface of the package substrate layer on the metallization structure;
   a second die on the first surface of the package substrate layer and on the first die, in which a performance level of the second die is greater than a performance level of the first die;
   through vias in the package substrate layer to couple pads of the second die to metal routing layers at a first surface of the metallization structure; and
   package bumps on a second surface of the metallization structure, opposite the first surface, and coupled to the pads of the second die through the metal routing layers.

2. The IC package of claim 1, in which a first surface of the first die is coplanar with the first surface of the package substrate layer.

3. The IC package of claim 1, in which a surface of the first die is directly bonded to a surface of the second die.

4. The IC package of claim 1, in which the second die comprises a logic die and the first die comprises a memory die.

5. The IC package of claim 1, in which a length of the second die is greater than a length of the first die.

6. The IC package of claim 1, in which the package substrate layer comprises a mold layer and the through vias comprise through mold vias (TMVs).

7. The IC package of claim 6, in which the mold layer comprises a spin-on oxide.

8. The IC package of claim 1, in which the metallization structure is comprised of a plurality of the metal routing layers within dielectric layers including an organic layer.

9. The IC package of claim 1, in which the package bumps comprise package solder balls.

10. A method for fabricating stacked dies within an integrated circuit (IC) package, comprising:
    encapsulating a first die in a package substrate layer having a first surface and a second surface, opposite the first surface;
    forming through vias in the package substrate layer;

forming a metallization structure on the second surface of the package substrate layer;
bonding a second die to the first surface of the package substrate layer;
directly bonding a surface of the second die to a surface of the first die; and
forming package bumps on a surface of the metallization structure, opposite the package substrate layer, to contact pads of the second die through metal routing layers of the metallization structure.

11. The method of claim 10, in which encapsulating comprises depositing a spin-on oxide layer to embed the first die in a mold layer.

12. The method of claim 11, in which forming the through vias comprises forming through mold vias (TMVs) through the mold layer.

13. The method of claim 10, in which forming the metallization structure comprises forming a plurality of the metal routing layers within dielectric layers including an organic layer on the second surface of the package substrate layer.

14. The method of claim 10, further comprising depositing a mold layer on the second die and exposed portions of the first surface of the package substrate layer.

15. An integrated circuit (IC) package, comprising:
a metallization structure;
means for storing data in a package substrate layer, having a first surface and a second surface, opposite the first surface, the second surface of the package substrate layer on the metallization structure, in which the package substrate layer comprises a mold layer, comprising a spin-on oxide;
an active die on the first surface of the package substrate layer and on the data storing means;
through vias in the package substrate layer to couple pads of the active die to metal routing layers at a first surface of the metallization structure; and
package bumps on a second surface of the metallization structure, opposite the first surface, and coupled to the pads of the active die through the metal routing layers.

16. The IC package of claim 15, in which the metallization structure is comprised of a plurality of the metal routing layers within dielectric layers including an organic layer.

17. The IC package of claim 15, in which the package bumps comprise package solder balls.

* * * * *